US010566564B2

(12) United States Patent
Lee et al.

(10) Patent No.: US 10,566,564 B2
(45) Date of Patent: Feb. 18, 2020

(54) LIGHT EMITTING DIODE AND LIGHT EMITTING DISPLAY DEVICE INCLUDING THE SAME

(71) Applicant: LG Display Co., Ltd., Seoul (KR)

(72) Inventors: Tae-Yang Lee, Paju-si (KR); Seul-Gi Choi, Paju-si (KR); Min-Surk Hyung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/160,486

(22) Filed: Oct. 15, 2018

(65) Prior Publication Data

US 2019/0115556 A1 Apr. 18, 2019

(30) Foreign Application Priority Data

Oct. 16, 2017 (KR) .......................... 10-2017-0133872

(51) Int. Cl.
*H01L 51/50* (2006.01)
*H01L 51/52* (2006.01)
(Continued)

(52) U.S. Cl.
CPC ....... *H01L 51/5064* (2013.01); *G09G 3/3225* (2013.01); *H01L 27/3246* (2013.01); *H01L 51/502* (2013.01); *H01L 51/5004* (2013.01); *H01L 51/5072* (2013.01); *H01L 51/5092* (2013.01); *H01L 51/5096* (2013.01); *H01L 51/5206* (2013.01); *H01L 51/5221* (2013.01); *H01L 51/5237* (2013.01); *G09G 2310/0264* (2013.01)

(58) Field of Classification Search
CPC combination set(s) only.
See application file for complete search history.

(56) References Cited

U.S. PATENT DOCUMENTS 9,525,148 B2 * 12/2016 Kazlas .................. B82Y 20/00
9,768,404 B1 * 9/2017 Steckel ............... H01L 27/1225
(Continued)

FOREIGN PATENT DOCUMENTS

TW 201119082 A1 6/2011
TW 201329196 A1 7/2013

OTHER PUBLICATIONS

Liu et al., "p-type Li, Cu-codoped NiOx hole-transporting layer for efficient planar perovskite solar cells," Optics Express, vol. 24, No. 22, Oct. 31, 2016, XP55566159, pp. A1349-A1359.
(Continued)

*Primary Examiner* — Mamadou L Diallo
(74) *Attorney, Agent, or Firm* — Birch, Stewart, Kolasch & Birch, LLP

(57) ABSTRACT

A light emitting diode and a light emitting display device are disclosed. The light emitting diode includes a first electrode and a second electrode facing each other; and a hole transporting layer between the first electrode and the second electrode, wherein the hole transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with.

27 Claims, 4 Drawing Sheets

(51) Int. Cl.
    *H01L 27/32*       (2006.01)
    *G09G 3/3225*     (2016.01)

(56)                References Cited

U.S. PATENT DOCUMENTS

| | | | |
|---|---|---|---|
| 2009/0212688 A1* | 8/2009 | Song ................... | H01L 51/508 |
| | | | 313/504 |
| 2017/0271605 A1 | 9/2017 | Steckel et al. | |
| 2017/0373266 A1* | 12/2017 | Xu ...................... | H01L 51/5096 |
| 2018/0237649 A1* | 8/2018 | Pan ...................... | C09D 11/36 |
| 2018/0327665 A1* | 11/2018 | Lee ..................... | C09K 11/883 |
| 2018/0337352 A1* | 11/2018 | Furno ................. | H01L 51/009 |
| 2019/0074462 A1* | 3/2019 | Park ..................... | H01L 51/502 |
| 2019/0123283 A1* | 4/2019 | Kathirgamanathan ...................... | |
| | | | C07D 339/08 |

OTHER PUBLICATIONS

Bansal et al., "Effect $Mn^{2+}$ $Cu^{2+}$ co-doping on structural and luminescent properties of ZnS nanoparticles", Ceramics International, vol. 43, 2017, pp. 7193-7201.

Hu et al., "Synthesis and properties of transition metals and rare-earth metals doped ZnS nanoparticles", Optical Materials, vol. 28, 2006, pp. 536-550.

\* cited by examiner $\Delta G'_H \simeq \Delta G_L$, $\Delta G'_H \simeq 0$ $\Delta G'_H \simeq \Delta G_L$, $\Delta G'_H \simeq 0$

LIGHT EMITTING DIODE AND LIGHT EMITTING DISPLAY DEVICE INCLUDING THE SAME

CROSS-REFERENCE TO RELATED APPLICATIONS

This application claims priority benefit under 35 U.S.C. § 119(a) of Korean Patent Application No. 10-2017-0133872 filed in the Republic of Korea on Oct. 16, 2017, which is hereby incorporated by reference in its entirety.

BACKGROUND OF THE INVENTION

Field of the Invention

The present invention relates to a light emitting diode, and more particularly, to a light emitting diode and a light emitting apparatus using the same in which a charge can be injected into a light emitting layer.

Discussion of the Related Art

Recently, as the technology for display processing and display of a large amount of information have rapidly advanced, various flat display devices have been developed. Among the flat display devices, an organic light emitting diode (OLED) display device and a quantum dot light emitting diode (QLED) display device are able to be thin and have a low power consumption. Thus, these flat display devices have been used as next generation display devices replacing a liquid crystal display device (LCD).

The OLED is an element configured such that when charges are injected into an organic light emitting layer formed between an electron injection electrode (i.e., an cathode) and a hole injection electrode (i.e., an anode), an electron and a hole form a pair and then a light is emitted while the pair becomes extinct.

The OLED has advantages of being formed on a flexible transparent substrate such as a plastic substrate, driving at a low voltage (e.g., 10V or less), having a low power consumption, and having an excellent color purity.

FIG. 1 is a schematic diagram of band gap energies of materials forming electrodes and light emitting layers of an OLED according to the related art.

Referring to FIG. 1, the OLED includes an anode and a cathode facing each other, and an emitting material layer (EML) between the anode and the cathode, a hole injection layer (HIL) and a hole transport layer (HTL) between the anode and the EML, and an electron transport layer (ETL) between the cathode and the EML.

The EML is made of a light emitting material, and a hole and an electron injected from the anode and the cathode, respectively, meet at the EML and form an exciton. By this energy, the light emitting material of the EML becomes an excited state. An energy transition of the light emitting material from the excited state into a ground state is produced, and a produced energy is emitted as a light.

In order to realize a light emission at the EML, the HIL and the HTL inject and transport a hole of a positive electric carrier from the anode to the EML, and the ETL injects and transports an electron of a negative electric carrier from the cathode to the EML. In order to inject and transport the hole and the electron to the EML, each layer should be made of a material having an appropriate band gap energy. In the related art, the light emitting layer forming the OLED is laminated using a deposition process. Recently, the light emitting layer is formed using a solution process that can reduce a waste of an organic material and does not need a color filter.

For example, the HIL may be made of poly(3,4-ethylene-dioxythiophene) polystyrene sulfonate (PEDOT:PSS), the HTL may be made of Poly[(9,9-dioctylfluorenyl-2,7-diyl)-co-(4,4'-(N-(4-sec-butylphenyl)diphenylamine)] (TFB), and the ETL may be made of an oxadiazole based organic material, a triazole based organic material, a benzoxazole based organic material, a benzothiazole based organic material, a benzimidazole based organic material, or a triazine based organic material, for example, 2-biphenyl-4-yl-5-(4-t-butylphenyl)-1,3,4-oxadiazole (PBD).

A highest occupied molecular orbital (HOMO) energy level of a light emitting material forming the EML is very low, and a lowest unoccupied molecular orbital (LUMO) energy level of the light emitting material forming the EML is very high. Thus, this serves as an energy barrier when a hole is transported from the HTL to the EML and when an electron is transported from the ETL to the EML.

However, compared with a difference $\Delta G_L$ between an LUMO energy level of the ETL and an LUMO energy level of the EML, a difference $\Delta G_H$ between a HOMO energy level of the HTL and the HOMO energy level of the EML is much greater. In other words, compared with the relatively high HOMO energy level of a hole transport material forming the HTL, the HOMO energy level of the light emitting material forming the EML is very low. Accordingly, compared with transport and injection of an electron to the EML, transport and injection of a hole to the EML is delayed, and thus charges are not injected in balance to the EML. This problem is very serious to an OLED using a quantum dot having a very low HOMO energy level as a light emitting material.

Electrons injected into the EML excessively compared to holes are recombined with holes thus do not form excitons and become extinct. Further, holes and electrons are not recombined at the light emitting material of the EML but are recombined at an interface of the EML and the HTL. Accordingly, a light emission efficiency of the OLED is reduced, and a high driving voltage is required to realize a desired light emission thus an increase of a power consumption is caused.

SUMMARY OF THE INVENTION

Accordingly, an embodiment of the present invention is directed to a light emitting diode and a light emitting apparatus including the same that substantially obviate one or more of the problems due to limitations and disadvantages of the related art, and have other advantages.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention, as embodied and broadly described herein, a light emitting diode includes: a first electrode and a second electrode facing each other; and a hole transporting layer between the first electrode and the second electrode, wherein the hole transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with.

In another aspect, a light emitting diode comprises: a first electrode and a second electrode facing each other; a first charge transporting layer between the first electrode and the second electrode and adjacent to the first electrode; a second charge transporting layer between the first electrode and the second electrode and adjacent to the second electrode; and an emitting material layer between the first charge transporting layer and the second charge transporting layer, wherein the first or second charge transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with.

In another aspect, a light emitting display device includes: a substrate; the above light emitting diode on the substrate; and a driving element between the substrate and the light emitting diode and connected to the light emitting diode.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 1:
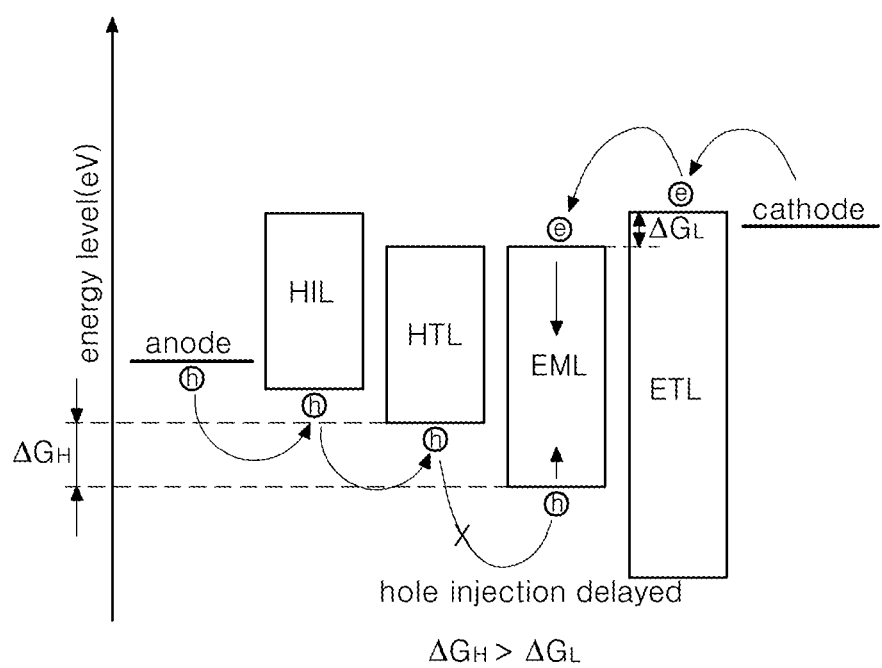
FIG. 1 is a schematic diagram of band gap energies of materials forming electrodes and light emitting layers of an OLED according to the related art.
Figure 2:
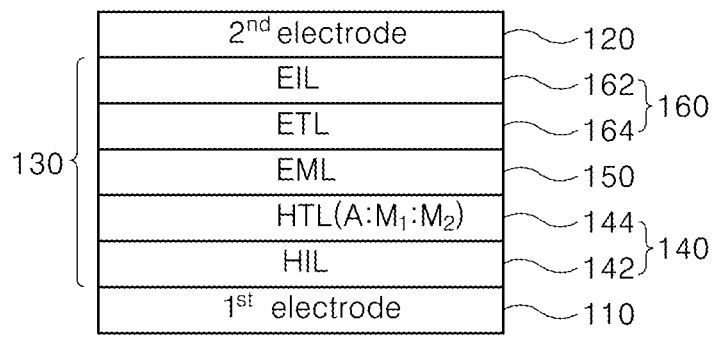
FIG. 2 is a schematic cross-sectional view illustrating a light emitting diode having a normal structure according to a first embodiment of the present invention.
Figure 3:
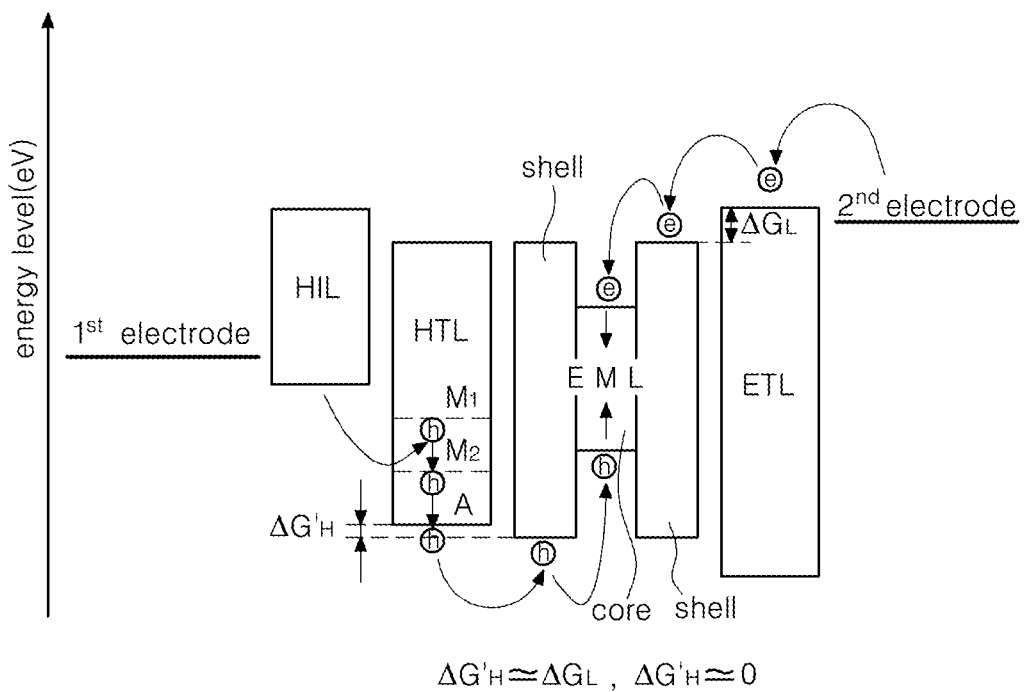
FIG. 3 is a schematic diagram of band gap energies of electrodes and a light emitting layer forming a light emitting diode according to a first embodiment of the present invention.

FIG. 2 is a schematic cross-sectional view illustrating a light emitting diode having a normal structure according to a first embodiment of the present invention, and FIG. 3 is a schematic diagram of band gap energies of electrodes and a light emitting layer forming a light emitting diode according to a first embodiment of the present invention.

As shown in FIG. 2, the light emitting diode 100 of the first embodiment includes a first electrode 110, a second electrode 120 facing the first electrode 110, a light emitting layer 130 including an emitting material layer (EML) 150 between the first and second electrodes 110 and 120. For example, the light emitting layer 130 may further include a first charge transporting layer 140 between the first electrode 110 and the EML 150, and a second charge transporting layer 160 between the EML 150 and the second electrode 120.

In this embodiment, the first electrode 110 may be an anode like a hole injection electrode. The first electrode 110 may be formed on a substrate made of glass or polymer. For example, the first electrode 110 may be made of a doped or non-doped metal oxide material selected from a group including indium-tin-oxide (ITO), indium-zinc-oxide (IZO), indium-tin-zinc oxide (ITZO), indium-copper-oxide (ICO), $SnO_2$, $In_2O_3$, Cd:ZnO, $F:SnO_2$, $In:SnO_2$, $Ga:SnO_2$ and Al:ZnO (AZO). Alternatively, the first electrode 110 may be made of a metal material or non-metal material selected from a group consisting of Ni, Pt, Au, Ag, Ir and carbon nanotube (CNT).

In this embodiment, the second electrode 120 may be a cathode like an electron injection electrode. For example, the second electrode 120 may be made of Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, each of the first electrode 110 and the second electrode 120 may be formed at a thickness of about 30 nm to about 300 nm.

In an alternative embodiment, for a bottom emission type light emitting diode, the first electrode 110 may be made of a transparent conductive material, such as ITO, IZO, ITZO, or AZO, and the second electrode 120 may be made of Ca, Ba, Ca/Al, LiF/Ca, LiF/Al, $BaF_2$/Al, Al, Mg, or Ag:Mg.

The first charge transporting layer 140 forming the light emitting layer 130 is between the first electrode 110 and the EML 150. In this embodiment, the first charge transporting layer 140 may be a hole transporting layer supplying holes to the EML 150. For example, the first charge transporting layer 140 may include a hole injection layer (HIL) 142 that is between the first electrode 110 and the EML 150 and is adjacent to the first electrode 110, and a hole transport layer (HTL) 144 that is between the first electrode 110 and the EML 150 and is adjacent to the EML 150.

The HIL 142 facilitates a hole injection from the first electrode 110 to the EML 150. For example, the HIL 142 may be made of, not limited to, an organic material selected from a group consisting of poly(ethylenedioxythiophene): polystyrenesulfonate (PEDOT:PSS), 4,4',4''-tris(diphenylamino)triphenylamine (TDATA) doped with tetrafluoro-tetracyano-quinodimethane (F4-TCNQ) (e.g., p-doped phthalocyanine, such as zinc phthalocyanine (ZnPc) doped with F4-TCNQ or the like, or N,N'-diphenyl-N,N'-bis(1-naphtyl)-1,1'-biphenyl-4,4''-diamine (α-NPD) doped with F4-TCNQ), hexaazatriphenylene-hexanitrile (HAT-CN), and their combination. For example, a dopant such as F4-TCNQ may be added with about 1 to about 30 weight % with respect to a host. The HIL 142 may be eliminated according to a structure or type of the light emitting diode 100.

The HTL 144 transports holes from the first electrode 110 to the EML 150. In the drawings, the first charge transporting layer 140 is configured to be divided into the HIL 142 and the HTL 144, and alternatively, the first charge transporting layer 140 may be formed at a single layer. For example, the HIL 142 is eliminated and the first charge transporting layer 140 may be configured only with the HTL 144.

In an alternative embodiment, the HTL 144 may be made of an inorganic compound configured with inorganic particles doped with at least two different metal positive ions. For example, an inorganic compound applied to the HTL 144 may be expressed with a below chemical formula 1.

$$A:M_1:M_2 \qquad \text{Chemical formula 1}$$

(in the formula, A is a semiconductor nano particle or a nano inorganic particle selected from a metal oxide group, and $M_1$ and $M_2$ are different from each other and represent metal positive ions which A is doped with).

In an embodiment, A of the chemical formula 1 may be a nano inorganic particle of a deep valence band energy level, corresponding to a HOMO energy level of an organic material. For example, A of the chemical formula 1 may be preferably a nano inorganic particle having a valence band energy level that is substantially the same as a HOMO energy level of a light emitting material forming the EML 150 described below.

For example, the nano inorganic particle expressed as A of the chemical formula 1 may have, not limited to, a valence band energy level of about −6.0 eV to about −7.5 eV, preferably about −6.5 eV to about −7.5 eV. In an embodiment, the nano inorganic particle expressed with A of the chemical formula 1 may be a semiconductor nano particle or metal oxide.

The semiconductor nano particle used as a host A of the HTL 144 may include, for example, a semiconductor nano particle of group II-VI, group III-V, group IV-VI or group I-III-VI. In detail, as the host of the HTL 144, the semiconductor nano particle expressed as the host A of the HTL 144 may be selected from a group consisting of ZnS, ZnSe, Cds, CdSe, CdZnS, GaP and their combination. The metal oxide used as the host of the HTL 144 may be selected from a group consisting of ZnO, $TiO_2$, CoO, CuO, $Cu_2O$, FeO, $In_2O_3$, MnO, NiO, PbO, $Ce_2O_3$, $MoO_3$ and their combination. However, it is not limited to the above materials.

Particularly, when the host of the HTL 144 uses the same material as a light emitting material of the EML 150 described below, an energy barrier between the HTL 144 and the EML 150 is removed, and thus a hole can be rapidly injected to the EML 150. For example, when a light emitting particle having a core-shell structure is used as a light emitting material of the EML 150, the host expressed as A of the chemical formula 1 may the same material as the shell.

Each of $M_1$ and $M_2$ of the chemical formula 1 may be preferably a metal positive ion that has a valance band energy level between a HOMO energy level of an organic material forming a first charge transporting layer 140 and a HOMO (or valence band) energy level of a light emitting material forming the EML 150. For example, each of the metal positive ions expressed as $M_1$ and $M_2$ of the chemical formula 1 may have, not limited to, a valence band energy level of about −5.5 eV to about −6.5 eV.

For example, each of the metal positive ions (i.e., $M_1$ and $M_2$ of the chemical formula 1) used as dopants of the HTL 144 may be selected from a group consisting of a transition metal positive ion, a poor metal (i.e., post-transition metal) (e.g., Al, Ga, In, Sn, Tl, Pb, Bi or the like) positive ion, a rare earth metal positive ion, and a lanthanide metal positive ion. In detail, each of the metal positive ions used as the dopants of the HTL 144 may be selected from a group consisting of $Ni^{2+}$, $Mn^{2+}$, $Pb^{2+}$, $Cu^+$, $Cu^{2+}$, $Co^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$ and $Sm^{3+}$.

A valence band energy level (corresponding to a HOMO of an organic material) of a nano inorganic particle used as a host (i.e., A of the chemical formula) in the HTL 144 is substantially equal to or very similar to a HOMO (or valence band) energy level of a light emitting material forming the ETL 150. However, when only the nano inorganic particle is used, a HOMO energy level difference between the HTL 144, and the HIL 142 or first electrode 110 becomes very large, thus an energy barrier between the HTL 144 and the HIL 142 or first electrode 110 is formed.

However, according to an embodiment of the present invention, the nano inorganic particle of a deep valence band energy level is doped with at least two different metal positive ions (e.g., $M_1$ and $M_2$). The metal positive ions have valance band energy levels between a HOMO energy level of the HIL 142 and a valance band energy level of the nano inorganic particle (i.e., A) used as a host of the HTL 144.

Thus, as schematically shown in FIG. 3, the HTL 144 may be configured such that a valance band energy level are divided into three energy level states (i.e., $M_1$ state, $M_2$ state, and A state) that are sequentially differentiated. When a hole is injected from the first electrode 110 to the HTL 144 via the HIL 142, the hole is first transferred to the metal positive ion ($M_1$) as a first dopant having a highest valance band energy level, then is transferred to the metal positive ion ($M_2$) as a second dopant having a second highest valance band energy level, and then is transferred to a host (A) having a lowest valance band energy level. In FIG. 3, it is shown that a valance band energy level of the HTL 144 sequentially decreases in order of a $M_1$ valance band energy level, a $M_2$ valance band energy level and an A valance band energy level. Alternatively, a valance band energy level of the HTL 144 sequentially decreases in order of a $M_2$ valance band energy level, a $M_1$ valance band energy level and an A valance band energy level.

In other words, the HTL 144 in an embodiment of the present invention forms a hole injection channel from a dopant having a highest valance band energy level to a host having a lowest valance band energy level. Thus, since a difference between a HOMO energy level of the HIL 142 and a valance band energy level of the first dopant ($M_1$) having a highest valance band energy level in the HTL 144 is not large, there is no HOMO energy barrier between the HIL 142 and the HTL 144.

Further, a valance band energy level of the host (A) finally receiving a hole in the HTL 144 is similar to or equal to a HOMO (or valence band) energy level of a light emitting material forming the EML 150. Accordingly, a difference $\Delta G'_H$ between a lowest valance band energy level of the HTL 144 and a HOMO (or valence band) energy level of the EML 150 is greatly reduced, thus an energy barrier between the HTL 144 and the EML 150 can be removed. In an optional embodiment, in case that a host (A) of the HTL 144 uses the same material as a shell forming the EML 150, there may be substantially no HOMO (or valence band) energy level difference between the HTL 144 and the EML 150.

In other words, by applying an inorganic compound expressed with the chemical formula 1 to the HTL 144, a difference $\Delta G'_H$ between a valance band energy level of the HTL 144 corresponding to a HOMO energy level and a HOMO (or valence band) energy level of the EML 150 becomes equal to or is not greatly different from a difference $\Delta G_L$ between a LUMO or conduction band energy level of the ETL 164 and a LUMO (or conduction band) energy level of the EML 150.

Accordingly, since holes and electrons are injected in balance to the EML 150 and form excitons, electrons that do not form excitons and become extinct are reduced or cease to exist. Further, a light emission is efficiently produced not at an interface of a charge transporting layer (e.g., HTL or ETL) adjacent to the EML 150 but at a light emitting material where the charges are injected. Therefore, a light emission efficiency of the light emitting diode 100 can be maximized, and a driving at a low voltage becomes possible and thus a power consumption can be reduced.

In an embodiment, with respect to the host (A), each of the dopant $M_1$ and $M_2$ of the HTL 144 may have about 0.05 to about 50 wt %, preferably about 0.1 to about 30 wt %, more preferably about 0.1 to about 5 wt %, and most preferably about 0.1 to about 1 wt %.

When a content of the dopant is less than about 0.05 wt %, it is difficult to expect an effect of improving a hole injection property due to a dopant addition. When a content of the dopant is greater than about 50 wt %, a valance band energy level of the host changes and a valance band energy level of the HTL 144 may rise.

FIG. 3 shows, by way of example, the light emitting diode 100 includes one HTL 144 between the HIL 142 and the EML 150. However, the HTL 144 may include a first HTL between the HIL 142 and the EML 150 and adjacent to the HIL 142, and a second HTL between the first HTL and the EML 150. In this case, the first HTL may be made of an organic material, and the second HTL may be made of an inorganic compound expressed with the chemical formula 1.

In an embodiment, in order for a hole to rapidly inject into the EML 150, the first HTL may use an organic material having a HOMO energy level between a HOMO energy level of the HIL 142 and a valance band energy level of the second HTL. For example, the first HTL may be made of a material selected from a group consisting of an aryl amine based material such as 4,4'-N,N'-dicarbazolyl-biphenyl (CBP), N,N'-diphenyl-N,N'-bis(1-naphtyl)-1,1'-biphenyl-4, 4''-diamine (α-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), 4,4',4''-tris(N-carbazolyl)-triphenylamine (TCTA), N,N'-di(naphthalene-1-yl)-N,N'-diphenyl-benzidine (NPB), (tris(3-methylphenylphenylamino)-triphenylamine (m-MTDATA), or spiro-NPB, polyaniline, polypyrrole, poly(phenylenevinylene), copper phthalocyanine, aromatictertiary amine or polynuclear aromatic tertiary amine, 4,4'-bis(p-carbazolyl)-1,1'-biphenyl compound, N,N, N',N'-tetraarylbenzidine, PEDOT:PSS and its derivatives, Poly(N-vinylcarbazole) (PVK) and its derivatives, poly(p) phenylenevinylene such as poly[2-methoxy-5-(2-ethylhexyloxy)-1,4-phenylenevinylene] (MEH-PPV) or poly[2-methoxy-5-(3',7'-dimethyloctyloxy)-1,4-phenylenevinylene] (MOMO-PPV) and its derivatives, polymethacrylate and its derivatives, poly(9,9-octylfluorene) and its derivatives, poly(spiro-fluorene) and its derivatives, poly(9,9'-dioctylfluorenyl-2,7-diyl)-co-(4,4'-(N-(4-sec-butylphenyl)diphenylamine (TFB), poly(4-butylphenyl-diphenyl amine) (poly-TPD), and their combination.

In alternative embodiment, the first HTL may use an organic material to which a solution process is practicable and which has a triamine moiety having an excellent hole mobility. This organic material may include, not limited to, Poly[N,N'-bis(4-butylphenyl)-N,N'-bis(phenyl)-benzidine] (poly-TPD, p-TPD), poly[(9,9-dioctylflorenyl-2,7-diyl)-co-(4,4'-(N-(4-sec-butylphenyl)diphenylamine))] (TFB), poly [(9,9-dioctylflorenyl-2,7-diyl)-co-(4,4'-(N-(p-butylphenyl) diphenylamine))], poly[bis(4-phenyl)(2,4,6-trimethylphenyl)amine] (PTAA), N,N'-Bis(3-methylphenyl)-N,N'-bis(phenyl)benzidine (TPD), N,N'-Bis(4-methylphenyl)-N,N'-bis(phenyl)benzidine, $N^1,N^4$-diphenyl-$N^1,N^4$-di-m-tolylbenzene-1,4-diamine (TTP), N,N,N',N'-tetra(3-methylphenyl)3,3'-dimethylbenzidine (HMTPD), di-[4-(N,N'-di-p-tolyl-amino)-phenyl] cyclohexane (TAPC), N4,N4'-Bis(4-(6-((3-ethyloxetan-3-yl) methoxy)hexyl)phenyl)-N4,N4'-diphenylbiphenyl-4,4'-diamine (OTPD), and 4,4',4''-tris(N,N-phenyl-3-methylphenylamino)triphenylamine.

The first charge transporting layer 140 including the HIL 142 and the HTL 144 may be formed by one or combination of a vacuum deposition process, such as vacuum vapor deposition or sputtering, and a solution process, such as spin coating, drop coating, dip coating, spray coating, roll coating, flow coating, casting process, screen printing or inkjet printing. For example, each of the HIL 142 and the HTL 144 may have a thickness of, not limited to, about 10 nm to about 200 nm, and preferably about 10 nm to about 100 nm.

The EML 150 may be made of inorganic light emitting particles or an organic light emitting materials. When the EML 150 is made of inorganic light emitting particles, the inorganic light emitting particle may be a nano inorganic light emitting particle such as a quantum dot (QD) or quantum rod (QR).

The QD or QR is an inorganic particle that emits light when an electron in an unstable state jumps down from a conduction band energy level to a valance band energy level. The nano inorganic light emitting particle has a very large extinction coefficient and has an excellent quantum yield among inorganic particles thus emits a strong fluorescent light. Further, a light emission wavelength changes according to a size of the nano inorganic light emitting particle, thus by adjusting a size of the nano inorganic light emitting particle, lights of an entire visible ray region can be obtained, and thus various colors can be realized. In other words, when the nano inorganic light emitting particle such as the QD or QR is used as a light emitting material, a color purity of each pixel can rise, and also a white light consisting of high-purity emitted red, green and blue lights can be realized.

In an embodiment, the QD or QR may have a single structure. In an alternative embodiment, the QD or QR may have a hetero-structure of core and shell. In this case, the shell may be formed with a single shell or a plurality of shells.

According to a reactivity and injection rate of reaction precursors forming the core and/or shell and a kind of ligand and a reaction temperature, a growth degree, a crystalline structure and the like of the nano inorganic light emitting particle can be adjusted, and thus light emission of various wavelengths according to adjustment of an energy band gap can be induced.

For example, the QD or QR may have a hetero-structure that includes a core component at a center thereof emitting a light, and a shell on a surface of the core enclosing the core to protect the core, and a ligand component may enclose a surface of the shell to disperse the QD or QR in a solvent. For example, the QD or QR may have a type-I core/shell structure that an electron and a hole move toward the core and a light is emitted while the electron and the hole being recombined, as a structure that an energy band gap of a component forming the core is enclosed by an energy band gap of the shell.

When the QD or QR is configured with the type-I core/ shell structure, the core is a part where a light emission is produced, and according to a size of the core, a light emission wavelength of the QD or QR is determined. To have a quantum confinement effect, the core needs to have a size less than an exciton Bohr radius according to each material, and needs to have an optical band gap at such the size.

The shell forming the QD or QR accelerates the quantum confinement effect of the core, and determines a stability of the QD or QR. Atoms exposed on a surface of a colloidal QD or QR of a single structure have lone pair electrons that do not participate in a chemical bonding, differently from inside atoms. An energy level of the surface atoms is located between a conduction band edge and a valance band edge of the QD or QR and can trap charges, thus a surface defect is formed. Because of a non-radiative recombination process of an exciton caused by the surface defect, the trapped charges may react with external oxygen and compound, and thus cause a modification of a chemical composition of the QD or QR, or a electric/optical characteristics may be lost permanently.

Accordingly, in a preferred embodiment, the QD or QR may have a core/shell hetero-structure. For the shell to be efficiently formed on a surface of the core, a lattice constant of a material forming the shell needs to be similar to that of a material forming the core. By enclosing the surface of the core with the shell, an oxidation of the core is prevented and thus a chemical stability of the QD or QR is improved, a loss of an exciton due to a surface trap at the surface of the core is minimized, a loss of an energy due to an atom vibration is prevented, and a quantum efficiency is improved.

The QD or QR may be a semiconductor nano crystal or metal oxide particle having a quantum confinement effect. For example, the QD or QR may include a nano semiconductor compound of a group II-VI, group III-V, group IV-VI or group I-III-VI. In more detail, a core and/or a shell forming the QD or QR may be a group II-VI compound semiconductor nano crystal such as CdS, CdSe, CdTe, ZnS, ZnSe, ZnTe, HgS, HgTe or their combination; a group III-V compound semiconductor nano crystal such as GaP, GaAs, GaSb, InP, InAs, InSb or their combination; a IV-VI group compound semiconductor nano crystal such as PbS, PbSe, PbTe or their combination; a group I-III-VI compound semiconductor nano crystal such as $AgGaS_2$, $AgGaSe_2$, $AgGaTe_2$, $AgInS_2$, $CuInS_2$, $CuInSe_2$, $CuGaS_2$, $CuGaSe_2$ or their combination; a metal oxide nano particle such as ZnO, $TiO_2$ or their combination; or a core-shell structure nano crystal such as CdSe/ZnSe, CdSe/ZnS, CdS/ZnSe, CdS/ZnS, ZnSe/ZnS, InP/ZnS, ZnO/MgO or their combination. The semiconductor nano particle may be doped with a rare-earth element such as Eu, Er, Tb, Tm, Dy or their combination, or a transition metal such as Mn, Cu, Ag, Al or their combination. Alternatively, the semiconductor nano crystal may not be doped.

For example, a core forming the QD or QR may be selected from a group consisting of ZnSe, ZnTe, CdSe, CdTe, InP, ZnCdS, $Cu_xIn_{1-x}S$, $Cu_xIn_{1-x}Se$, $Ag_xIn_{1-x}S$ and their combination. A shell forming the QD or QR may be selected from a group consisting of ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $CdxZn_{1-x}S$ and their combination.

The QD may be an alloy QD such as a homogeneous alloy QD or gradient alloy QD (e.g., $CdSxSe_{1-x}$, $CdSexTe_{1-x}$, or $ZnxCd_{1-x}Se$).

When the EML 150 is made of inorganic light emitting particles such as QDs or QRs, a solution of a solvent containing QDs or QRs is coated on the first charge transporting layer 140, for example, the HTL 144 using a solution process, then the solvent is volatilized, and thus the EML 150 is formed.

In an embodiment, the EML 150 may be formed by coating a dispersion solution of a solvent with QDs or QRs contained therein on the first charge transporting layer 140 through a solution process and volatilizing the solvent. The EML 150 may be laminated by one or combination of solution processes e.g., spin coating, drop coating, dip coating, spray coating, roll coating, flow coating, casting process, screen printing and inkjet printing.

In an embodiment, the EML 150 may include a QD or QR as a nano inorganic light emitting particle having a PL light emission property of 440 nm, 530 nm and 620 nm to form a white light emitting diode. Alternatively, the EML 150 may include a QD or QR as a nano light emitting particle having one color of red, green and blue to individually emit the one color.

In another embodiment, the EML 150 may be made of an organic light emitting material. When the EML 150 is made of an organic light emitting material, there is no limit for an organic light emitting material if it is typically used. For example, the EML 150 may be made of an organic light emitting material emitting at least one of red, green and blue, and may include a fluorescent or phosphorescent material. Further, an organic light emitting material forming the EML 150 may include a host and a dopant. In case that an organic light emitting material is formed by a host-dopant system, the dopant may have, not limited to, about 1 wt % to about 50 wt %, preferably about 1 wt % to about 30 wt % with respect to a weight of the host.

An organic host for the EML 150 may use a typically used organic material. For example, the organic host used for the EML 150 may be made of Tris(8-hydroxyquinoline)aluminum ($Alq_3$), TCTA, PVK, 4,4'-bis(N-carbazolyl)-1,1'-biphenyl (CBP), 4,4'-Bis(9-carbazolyl)-2,2'-dimethylbiphenyl (CDBP), 9,10-di(naphthalene-2-yl)anthracene (ADN), 3-tert-butyl-9,10-di(naphtha-2-yl)anthracene (TBADN), 2-methyl-9,10-bis(naphthalene-2-yl)anthracene (MADN), 1,3,5-tris(N-phenylbenzimidazole-2-yl)benzene (TPBi), distyrylarylene (DSA), mCP, or 1,3,5-tris(carbazol-9-yl)benzene (TCP).

When the EML 150 emits a red, a dopant contained in the EML 150 may include, not limited to, an organic material e.g., 5,6,11,12-tetraphenylnaphthalene (Rubrene), Bis(2-benzo[b]-thiophene-2-yl-pyridine)(acetylacetonate)iridium (III) ($Ir(btp)_2(acac)$), Bis[1-(9,9-diemthyl-9H-fluorn-2-yl)-isoquinoline](acetylacetonate)iridium(III) ($Ir(fliq)_2(acac)$), Bis[2-(9,9-diemthyl-9H-fluorn-2-yl)-quinoline](acetylacetonate)iridium(III) ($Ir(flq)_2(acac)$), Bis-(2-phenylquinoline)(2-(3-methylphenyl)pyridinate)iridium(III) ($Ir(phq)_2typ$), or Iridium(III)bis(2-(2,4-difluorophenyl)quinoline)picolinate (FPQIrpic), or an organic metal complex.

When the EML 150 emits a green, a dopant contained in the EML 150 may include, not limited to, an organic material e.g., N,N'-dimethyl-quinacridone (DMQA), coumarin 6, 9,10-bis[N,N-di-(p-tolyl)amino]anthracene (TTPA), 9,10-bis[phenyl(m-tolyl)-amino]anthracene (TPA), bis(2-phenylpyridine)(acetylacetonate)iridium(III) ($Ir(ppy)_2(acac)$), fac-tris(phenylpyridine)iridium(III) ($fac-Ir(ppy)_3$), or tris[2-(p-tolyl)pyridine]iridium(III) ($Ir(mppy)_3$), or an organic metal complex.

When the EML 150 emits a blue, a dopant contained in the EML 150 may include, not limited to, an organic material e.g., 4,4'-bis[4-(di-p-tolylamino)styryl]biphenyl (DPAVBi), perylene, 2,5,8,11-tetra-tert-butylperylene (TBPe), bis(3,5-difluoro-2-(2-pyridyl)phenyl-(2-carbozylpyridyl)iridium(III) (FirPic), mer-tris(1-phenyl-3-methylimidazolin-2ylidene-C,C2')iridium(III) (mer-Ir(pmi)$_3$), or tris(2-(4,6-difluorophenyl)pyridine)iridium(III) (Ir(Fppy)$_3$), or an organic metal complex.

When the EML 150 is made of an organic light emitting material, the EML 150 may be formed by one or combination of a vacuum deposition process, such as vacuum vapor deposition or sputtering, and a solution process, such as spin coating, drop coating, dip coating, spray coating, roll coating, flow coating, casting process, screen printing or inkjet printing.

The second charge transporting layer 160 is located between the EML 150 and the second electrode 120. In this embodiment, the second charge transporting layer 160 may be an electron transporting layer supplying an electron to the EML 150. In an embodiment, the second charge transporting layer 160 may include an electron injection layer (EIL) 162 that is between the second electrode 120 and the EML 150 and is adjacent to the second electrode 120, and an electron transport layer (ETL) 164 that is between the second electrode 120 and the EML 150 and is adjacent to the EML 150.

The EIL 162 facilitates an electron injection from the second electrode 120 to the EML 150. For example, the EIL 162 may be made of a fluorine-doped or fluorine-combined metal, e.g., Al, Cd, Cs, Cu, Ga, Ge, In or Li, or a doped or non-doped metal oxide, e.g., $TiO_2$, ZnO, ZrO, $SnO_2$, $WO_3$ or $Ta_2O_3$, and a dopant for the metal oxide may be one of Al, Mg, In, Li, Ga, Cd, Cs and Cu.

The ETL 164 transports an electron to the EML 150. The ETL 164 may be formed of an inorganic material and/or an organic material. The inorganic material for the ETL 164 may be selected from a group consisting of a doped or non-doped metal/non-metal oxide, e.g., $TiO_2$, ZnO, ZnMgO, ZrO, $SnO_2$, $WO_3$, $Ta_2O_3$, $HfO_3$, $Al_2O_3$, $ZrSiO_4$, $BaTiO_3$ or $BaZrO_3$, a doped or non-doped semiconductor particle, e.g., CdS, ZnSe or ZnS, nitride, e.g., $Si_3N_4$, and their combination. The dopant for the metal/non-metal oxide may be one of Al, Mg, In, Li, Ga, Cd, Cs and Cu, and the dopant for the semiconductor particle may be one of Al, Mg, In, Li, Ga, Cd, Cs and Cu.

When the ETL 164 is formed of an organic material, the ETL 164 may use an oxazole-based compound, an isooxazole-based compound, triazole-based compound, an isothiazole-based compound, an oxadiazole-based compound, a phenanthroline-based compound, a perylene-based compound, a benzoxazole-based compound, benzothiazole-based compound, benzimidazole-based compound, a pyrene-based compound, a triazine-based compound or an aluminum complex. In detail, the organic material for the ETL 164 may be selected from a group consisting of 3-(biphenyl-4-yl)-5-(4-tertbutylphenyl)-4-phenyl-4H-1,2,4-triazole (TAZ), bathocuproine, 2,9-dimethyl-4,7-diphenyl-1,10-phenanthroline (BCP), 2,2',2''-(1,3,5-Benzinetriyl)-tris(1-phenyl-1-H-benzimidazole) (TPBi), 2-[4-(9,10-di-2-naphthalenyl-2-anthracenyl)phenyl]-1-phenyl-1H-benzimidazole, tris(8-hydroxyquinoline)aluminum (Alq$_3$), bis(2-methyl-8-quninolinato)-4-phenylphenolatealuminum (III) (Balq), 8-hydroxy-quinolinato lithium (Liq), bis(2-methyl-quinolinato)(tripnehylsiloxy) aluminum (III) (Salq) and their combination, but it is not limited thereto.

In FIG. 2, like the first charge transporting layer 140, the second charge transporting layer 160 is shown with double layers of the EIL 162 and the ETL 164, and alternatively, the second charge transporting layer 160 may be formed with a single layer of the ETL 164. Further, the second charge transporting layer 160 may be formed with a single layer of the ETL 164 that is made of the above inorganic electron transport material blended with cesium carbonate.

The second charge transporting layer 160 including the EIL 162 and/or the ETL 164 may be formed by a vacuum deposition process, e.g., vacuum vapor deposition or sputtering, or a solution process, e.g., spin coating, drop coating, dip coating, spray coating, roll coating, flow coating, casting process, screen printing or inkjet printing. The vacuum deposition process and the solution process, singly or in combination, are used to form the second charge transporting layer 160. For example, each of the EIL 162 and the ETL 164 may have a thickness of, not limited to, about 10 nm to about 200 nm, preferably about 10 nm to about 100 nm.

For example, when a hybrid charge transporting layer (CTL) with the HTL 144 of the first charge transporting layer 140 made of an organic material and the second charge transporting layer 160 made of an organic material is employed, the emission property of the light emitting diode 100 can be improved.

When a hole is transported into the second electrode 120 via the EML 150 or an electron is transported into the first electrode 110 via the EML 150, a lifetime and a efficiency of the diode may be reduced. To prevent this problem, the light emitting diode 100 of this embodiment may include at least one exciton blocking layer adjacent to the EML 150.

For example, the light emitting diode 100 may include an electron blocking layer (EBL) that is formed between the HTL 144 and the EML 150 and can control and prevent an electron transport.

For example, the EBL may be formed of TCTA, tris[4-(diethylamino)phenyl]amine), N-(biphenyl-4-yl)9,9-dimethyl-N-(4-(9-phenyl-9H-carbazazole-3-yl)phenyl)-9H-fluorene-2-amine, tri-p-tolylamine, 1,1-bis(4-(N,N'-di(p-tolyl)amino)phenyl)cyclohexane (TAPC), m-MTDATA, 1,3-bis(N-carbazolyl)benzene (mCP), 3,3'-bis(N-carbazolyl)-1,1'-biphenyl (mCBP), poly-TPD, copper phthalocyanine (CuPc), DNTPD, or 1,3,5-tris[4-(diphenylamino)phenyl]benzene (TDAPB).

Further, a hole blocking layer (HBL) as a second exciton blocking layer may be formed between the EML 150 and the ETL 164 to prevent a hole transport between the EML 150 and the ETL 164. In an embodiment, the HBL may be formed of a material used for the ETL 164, for example, an oxadiazole-based compound, a triazole-based compound, a phenanthroline-based compound, a benzoxazole-based compound, benzothiazole-based compound, benzimidazole-based compound, a triazine-based compound or a pyrene-based compound.

For example, the HBL may be made of a material, which has a HOMO energy level smaller than that of the EML 150, for example, 2,9-dimethyl-4,7-diphenyl-1,10-phenanthroline (BCP), BAlq, Alq$_3$, PBD, spiro-PBD or Liq.

As described above, according to this embodiment, the HTL 144 of the first charge transporting layer 140 located between the first electrode 110 and the EML 150 includes an inorganic compound that is a nano inorganic particle, having a low valance band energy level, doped with at least two different metal positive ions having valance band energy levels higher than that of the nano inorganic particle. By decreasing a HOMO energy level of the HTL 144, a HOMO energy barrier between the HTL 144 and the EML 150 can decrease, and a HOMO energy barrier between the HIL 142 and the HTL 144 can decrease. A hole and an electron are injected in balance into the EML 150, thus a light emission efficiency of the light emitting diode 100 can be improved, and a low voltage driving is possible thus a power consumption can be reduced.

FIGS. 2 and 3 describe the light emitting diode of a normal structure including the hole transporting layer located between the first electrode of a relatively low work function and the EML and the electron transporting layer located between the second electrode of a relatively high work function and the EML. Alternatively, the light emitting diode may have an inverted structure other than the normal structure, which is described below.

Figure 4:
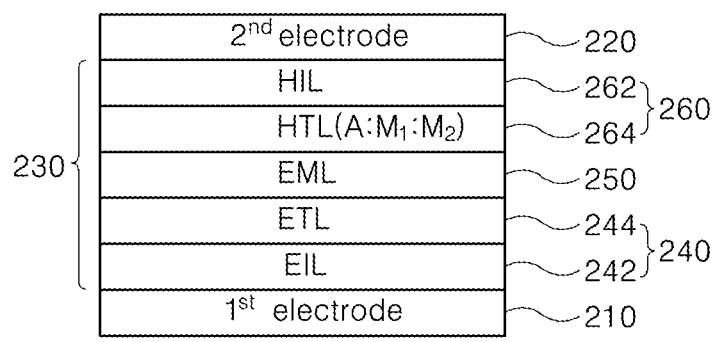
FIG. 4 is a schematic cross-sectional view illustrating a light emitting diode having an inverted structure according to a second embodiment of the present invention.
Figure 5:
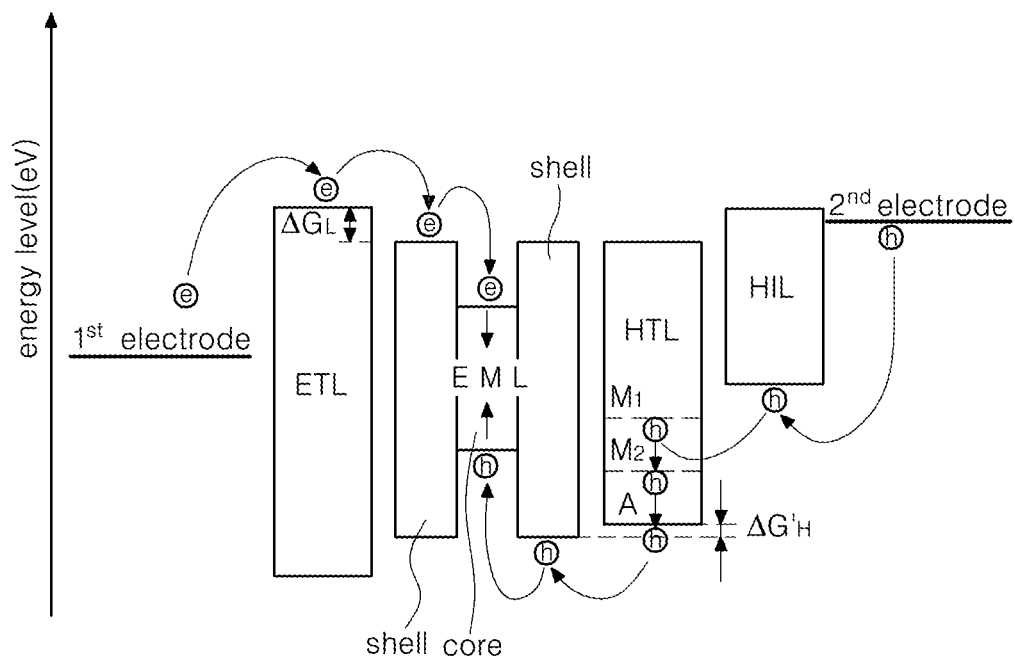
FIG. 5 is a schematic diagram of band gap energies of electrodes and a light emitting layer forming a light emitting diode according to a second embodiment of the present invention.

Next, FIG. 4 is a schematic cross-sectional view illustrating a light emitting diode having an inverted structure according to a second embodiment of the present invention, and FIG. 5 is a schematic diagram of band gap energies of electrodes and a light emitting layer forming a light emitting diode according to a second embodiment of the present invention.

As shown in FIG. 4, the light emitting diode 200 of the second embodiment includes a first electrode 210, a second electrode 220 facing the first electrode 210, a light emitting layer 230 including an EML 250 between the first and second electrodes 210 and 220. The light emitting layer 230 may further include a first charge transporting layer 240 between the first electrode 210 and the EML 250, and a second charge transporting layer 260 between the EML 250 and the second electrode 220.

In this embodiment, the first electrode 210 may be an cathode like an electron injection electrode. For example, the first electrode 210 may be made of a doped or non-doped metal oxide material, for example, ITO, IZO, ITZO, ICO, $SnO_2$, $In_2O_3$, Cd:ZnO, F:$SnO_2$, In:$SnO_2$, Ga:$SnO_2$, or AZO. Alternatively, the first electrode 210 may be made of a material different from the above materials, for example, Ni, Pt, Au, Ag, Ir, or carbon nanotube (CNT).

In this embodiment, the second electrode 220 may be an anode like a hole injection electrode. For example, the second electrode 220 may be made of Ca, Ba, Ca/Al, LiF/Ca, LiF/Al, $BaF_2$/Al, CsF/Al, $CaCO_3$/Al, $BaF_2$/Ca/Al, Al, Mg, Au:Mg, or Ag:Mg. For example, each of the first electrode 210 and the second electrode 220 may be formed at a thickness of about 30 nm to about 300 nm.

In this embodiment, the first charge transporting layer 240 may be an electron transporting layer supplying an electron to the EML 250. In an embodiment, the first charge transporting layer 240 may include an EIL 242 that is between the first electrode 210 and the EML 250 and is adjacent to the first electrode 210, and an ETL 244 that is between the first electrode 210 and the EML 250 and is adjacent to the EML 250.

The EIL 242 may be formed of a fluorine-doped or fluorine-combined metal, e.g., Al, Cd, Cs, Cu, Ga, Ge, In or Li, or a doped or non-doped metal oxide, e.g., $TiO_2$, ZnO, ZrO, $SnO_2$, $WO_3$ or $Ta_2O_3$, and a dopant for the metal oxide may be one of Al, Mg, In, Li, Ga, Cd, Cs and Cu.

The ETL 244 may be formed of an inorganic material and/or an organic material. The inorganic material for the ETL 244 may be selected from a group consisting of a doped or non-doped metal/non-metal oxide, e.g., $TiO_2$, ZnO, ZnMgO, ZrO, $SnO_2$, $WO_3$, $Ta_2O_3$, $HfO_3$, $Al_2O_3$, ZrSiO4, $BaTiO_3$ or $BaZrO_3$, a doped or non-doped semiconductor particle, e.g., CdS, ZnSe or ZnS, nitride, e.g, $Si_3N_4$, and their combination. The dopant for the metal/non-metal oxide may be one of Al, Mg, In, Li, Ga, Cd, Cs and Cu, and the dopant for the semiconductor particle may be one of Al, Mg, In, Li, Ga, Cd, Cs and Cu.

When the ETL 244 is formed of an organic material, the ETL 244 may use an oxazole-based compound, an isooxazole-based compound, triazole-based compound, an isothiazole-based compound, an oxadiazole-based compound, a phenanthroline-based compound, a perylene-based compound, a benzoxazole-based compound, benzothiazole-based compound, benzimidazole-based compound, a pyrene-based compound, a triazine-based compound or an aluminum complex. In detail, the organic material for the ETL 244 may be selected from a group consisting of 3-(biphenyl-4-yl)-5-(4-tertbutylphenyl)-4-phenyl-4H-1,2,4-triazole (TAZ), bathocuproine, 2,9-dimethyl-4,7-diphenyl-1,10-phenanthroline (BCP), 2,2',2"-(1,3,5-Benzinetriyl)-tris (1-phenyl-1-H-benzimidazole) (TPBi), 2-[4-(9,10-di-2-naphthalenyl-2-anthracenyl)phenyl]-1-phenyl-1H-benzimidazole, tris(8-hydroxyquinoline)aluminum ($Alq_3$), bis(2-methyl-8-quninolinato)-4-phenylphenolatealuminum (III) (Balq), 8-hydroxy-quinolinato lithium (Liq), bis(2-methyl-quinolinato)(tripnehylsiloxy) aluminum (III) (Salq) and their combination, but it is not limited thereto.

The first charge transporting layer 240 may be formed with a single layer of the ETL 244. Further, the first charge transporting layer 240 may be formed with a single layer of the ETL 244 that is made of the above inorganic electron transport material blended with cesium carbonate. For example, each of the EIL 242 and the ETL 244 may have a thickness of, not limited to, about 10 nm to about 200 nm, preferably about 10 nm to about 100 nm.

The EML 250 may be made of inorganic light emitting particles or an organic light emitting material. The inorganic light emitting particle may be a nano inorganic light emitting particle e.g., a QD or QR. The QD or QR may have a single structure or a core/shell hetero-structure.

The QD or QR may be a semiconductor nano crystal or metal oxide particle having a quantum confinement effect. For example, the QD or QR may include a nano semiconductor compound of a group II-VI, group III-V, group IV-VI or group I-III-VI. In more detail, a core and/or a shell forming the QD or QR may be a group II-VI compound semiconductor nano crystal such as CdS, CdSe, CdTe, ZnS, ZnSe, ZnTe, HgS, HgTe or their combination; a III-V group compound semiconductor nano crystal, such as GaP, GaAs, GaSb, InP, InAs, InSb or their combination; a group IV-VI compound semiconductor nano crystal, such as PbS, PbSe, PbTe or their combination; a group I-III-VI compound semiconductor nano crystal, such as $AgGaS_2$, $AgGaSe_2$, $AgGaTe_2$, $AgInS_2$, $CuInS_2$, $CuInSe_2$, $CuGaS_2$, $CuGaSe_2$ or their combination; a metal oxide nano particle, such as ZnO, $TiO_2$ or their combination; or a core-shell structure nano crystal, such as CdSe/ZnSe, CdSe/ZnS, CdS/ZnSe, CdS/ZnS, ZnSe/ZnS, InP/ZnS, ZnO/MgO or their combination. The semiconductor nano particle may be doped with a rare-earth element, such as Eu, Er, Tb, Tm, Dy or their combination, or a transition metal, such as Mn, Cu, Ag, Al or their combination. Alternatively, the semiconductor nano crystal may not be doped.

When the EML 250 is made of inorganic light emitting particles such as QDs or QRs, a solution of a solvent containing QDs or QRs is coated on the first charge transporting layer 240, for example, the HTL 244 using a solution process, then the solvent is volatilized, and thus the EML 250 is formed.

When the EML 250 is made of an organic light emitting material, the EML 250 may be made of an organic light emitting material emitting at least one of red, green and blue, and may include a fluorescent or phosphorescent material. Further, an organic light emitting material of the EML 250 may include a host and a dopant. When an organic light emitting material is formed by a host-dopant system, the dopant may have, not limited to, about 1 wt % to about 50 wt %, preferably about 1 wt % to about 30 wt % with respect to a weight of the host.

When the EML 250 is made of an organic light emitting material, the EML 250 may be formed by one or combination of a vacuum deposition process, such as vacuum vapor deposition or sputtering, and a solution process, such as spin coating, drop coating, dip coating, spray coating, roll coating, flow coating, casting process, screen printing or inkjet printing.

In this embodiment, the second charge transporting layer 260 may be a hole transporting layer supplying a hole to the EML 250. In an embodiment, the second charge transporting layer 260 may include a HIL 262 between the second electrode 220 and the EML 250 and is adjacent to the second electrode 220, and a HTL 264 between the second electrode 220 and the EML 250 and is adjacent to the EML 250.

The HIL 262 may be made of, not limited to, an organic material selected from a group consisting of PEDOT:PSS, TDATA doped with F4-TCNQ e.g., p-doped phthalocyanine, such as zinc phthalocyanine (ZnPc) doped with F4-TCNQ or the like, or α-NPD doped with F4-TCNQ, hexaazatriphenylene-hexanitrile (HAT-CN), and their combination. For example, a dopant such as F4-TCNQ may be added with about 1 wt % to about 30 wt % with respect to a host. The HIL 262 may be eliminated according to a structure or type of the light emitting diode 200.

As expressed with the chemical formula 1, the HTL 264 may be made of an inorganic compound that is an inorganic particle (A), having a low valance band energy level, doped with at least two different metal positive ions ($M_1$ and $M_2$) having appropriate valance band energy levels.

If needed, the HTL 264 may include a first HTL between the second electrode 220 and the EML 250 and adjacent to the HIL 262, and a second HTL between the first HTL and the EML 250. In this case, the first HTL may be made of an organic material, and the second HTL may be made of an inorganic compound expressed with the chemical formula 1.

The second charge transporting layer 260 may be formed with a single layer. For example, the second charge transporting layer 260 may be formed with no HIL 262 and only HTL 264. Each of the HIL 262 and the HTL 264 may have a thickness of, not limited to, about 10 nm to about 200 nm, preferably about 10 nm to about 100 nm.

In a similar way to the first embodiment, the light emitting diode 200 of this embodiment may include at least one exciton blocking layer adjacent to the EML 250. For example, the light emitting diode 200 may include an electron blocking layer (EBL) which is located between the EML 250 and the HTL 264 to control and prevent an electron transport, and/or a hole blocking layer (HBL), which is located between the ETL 244 and the EML 250 to control and prevent a hole transport.

In the light emitting diode 200 of this embodiment, the HTL 264 of the second charge transporting layer 260 includes an inorganic compound expressed with the chemical formula 1.

A hole injected to the HTL 264 via the HIL 262 transports through a hole injection channel caused by a relative valance band energy level difference between dopants ($M_1$ and $M_2$) and a host (A). Accordingly, as schematically shown in FIG. 5, a difference $\Delta G'_H$ between a HOMO energy level of the HTL 264 and a HOMO (or valance band) energy level of the EML 250 is greatly reduced (or, in case that a host (A) of the HTL 264 uses the same material as a shell of the EML 250, there is substantially no HOMO energy level difference between the HTL 264 and the EML 250), thus an energy barrier between the HTL 264 and the EML 250 can be removed.

In other words, by applying an inorganic compound expressed with the chemical formula 1 to the HTL 264, a difference $\Delta G'_H$ between a HOMO energy level of the HTL 264 and a HOMO energy level of the EML 250 becomes equal to or is not greatly different from a difference $\Delta G_L$ between a LUMO energy level of the ETL 244 and a LUMO energy level of the EML 250. Accordingly, since holes and electrons are injected in balance to the EML 250 and form excitons, electrons that do not form excitons and become extinct are reduced or cease to exist. Further, a light emission is efficiently produced not at an interface of a charge transporting layer (e.g., HTL or ETL) adjacent to the EML 250 but at a light emitting material where the charges are injected. Therefore, a light emission efficiency of the light emitting diode 200 can be maximized, and a driving at a low voltage becomes possible thus a power consumption can be reduced.

Figure 6:
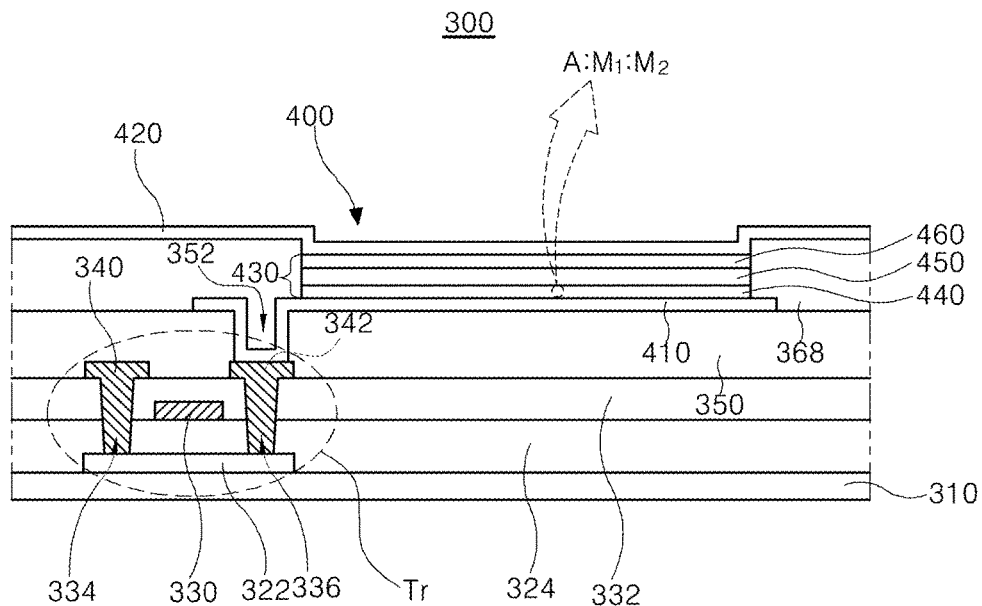
FIG. 6 is a schematic cross-sectional view illustrating a light emitting display device according to an embodiment of the present invention.

The light emitting diode in which an inorganic compound of a host, having a low valance band energy level, doped with two metal positive ions is applied to the hole transporting layer according to an embodiment of the present invention may be applied to an illumination apparatus or a light emitting apparatus such as a display device. For example, a light emitting apparatus including the light emitting diode according to an embodiment of the present invention is explained. FIG. 6 is a schematic cross-sectional view illustrating a light emitting display device according to an embodiment of the present invention.

As shown in FIG. 6, the light emitting display device 300 includes a substrate 310, a driving thin film transistor (TFT) Tr as a driving element located on the substrate 310, and a light emitting diode 400 connected to the driving TFT Tr.

A semiconductor layer 322 is formed on the substrate 310 and is made of an oxide semiconductor material or polycrystalline silicon. When the semiconductor layer 322 is made of an oxide semiconductor material, a light shielding pattern may be formed below the semiconductor layer 322, and the light shielding pattern prevents a light from being incident on the semiconductor layer 322, thus prevents deterioration of the semiconductor layer 322 by a light. Alternatively, the semiconductor layer 322 may be made of polycrystalline silicon, and in this case, both sides of the semiconductor layer 322 may be doped with impurities.

A gate insulating layer 324 is formed on the semiconductor layer 322. The gate insulating layer 324 may be made of an inorganic insulating material such as silicon oxide or silicon nitride. A gate electrode 330, which is formed of a conductive material, e.g., metal, is formed on the gate insulating layer 324 to correspond to a center of the semiconductor layer 322.

An inter-layered insulating layer 332, which is made of an insulating material, is formed on an entire surface of the substrate 310 including the gate electrode 330. The inter-layered insulating layer 332 may be made of an inorganic insulating material, e.g., silicon oxide or silicon nitride, or an organic insulating material, e.g., benzocyclobutene or photo-acryl.

The inter-layered insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330. A source electrode 340 and a drain electrode 342, which are made of a conductive material, e.g., metal, are formed on the interlayered insulating layer 332.

The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the driving TFT Tr.

In FIG. 6, the driving TFT Tr has a coplanar structure that the gate electrode 330, the source electrode 340 and the drain electrode 342 are positioned over the semiconductor layer 322. Alternatively, the driving TFT may have an inverted staggered structure that a gate electrode is positioned under a semiconductor layer, and source and drain electrodes are positioned over the semiconductor layer. In this instance, the semiconductor layer may include amorphous silicon.

In addition, a gate line and a data line cross each other to define a pixel region, and a switching element, which is electrically connected to the gate line and the data line, is formed. The switching element is electrically connected to the driving TFT Tr as the driving element. In addition, a power line is formed to be parallel with and be spaced apart from the gate line or the data line. Moreover, a storage capacitor to maintain a voltage of the gate electrode 330 of the driving TFT Tr during one frame may be formed.

A passivation layer 350, which includes a drain contact hole 352 exposing the drain electrode 342 of the driving TFT Tr, is formed to cover the driving TFT Tr.

A first electrode 410, which is connected to the drain electrode 342 of the driving TFT Tr through the drain contact hole 352, is separately formed in each pixel region and on the passivation layer 350. The first electrode 410 may be an anode or cathode and be formed of a conductive material having a relatively high work function. For example, the first electrode 410 may be made of a doped or non-doped metal oxide e.g., ITO, IZO, ITZO, ICO, $SnO_2$, $In_2O_3$, Cd:ZnO, F:$SnO_2$, In:$SnO_2$, Ga:SnO, or AZO, or a metal material e.g., Ni, Pt, Au, Ag, Ir or carbon nanotube (CNT).

When the light emitting display device 300 is operated in a top-emission type, a reflection electrode or reflection layer may be formed below the first electrode 410. For example, the reflection electrode or reflection layer may be formed of aluminum-palladium-copper (APC) alloy.

A bank layer 368, which covers edges of the first electrode 410, is formed on the passivation layer 350. The bank layer 368 exposes a center of the first electrode 410 in the pixel region.

A light emitting layer 430 is formed on the first electrode 410. The light emitting layer 430 may be formed with only an EML, and alternatively, may further include a plurality of charge transporting layers to improve the emission efficiency. For example, as shown in FIG. 6, the light emitting layer 430 may include a first charge transporting layer 440, an EML 450 and a second charge transporting layer 460 which are sequentially stacked between the first electrode 410 and the second electrode 420.

For example, the first charge transporting layer 440 may be a hole transporting layer, and may include a HIL (142 of FIG. 2) of an organic material and a HTL (144 of FIG. 2). The HTL of the first charge transporting layer 440 includes an inorganic compound of the chemical formula 1. If needed, the HTL may include a first HTL, which is located between the HIL (142 of FIG. 2) and the EML 450 and is adjacent to the HIL and may be made of an organic material, and a second HTL which is located between the first HTL and the EML 450 and is made of an inorganic compound of the chemical formula 1.

The EML 450 may be made of an inorganic emitting particle or organic emitting material. The second charge transporting layer 460 may be an electron transporting layer, may include a EIL (162 of FIG. 2) and a ETL (164 of FIG. 2). For example, the second charge transporting layer 460 may be made of an inorganic material or organic material.

A second electrode 420 is formed on the substrate 310 including the light emitting layer 430. The second electrode 420 is located over an entire surface of the display area. The second electrode 420 may be formed of a conductive material having a relatively low work function. The second electrode 420 may be a cathode or anode. For example, the second electrode 420 may be formed of Ca, Ba, Ca/Al, LiF/Ca, LiF/Al, $BaF_2$/Al, CsF/Al, $CaCO_3$/Al, $BaF_2$/Ca/Al, Al, Mg, Au—Mg alloy or Ag—Mg alloy.

In FIG. 6, the light emitting diode of a normal structure is shown by way of example, where the first charge transporting layer 440 as the hole transporting layer is positioned between the first electrode 410 and the EML 450 and the second charge transporting layer 460 as the electron transporting layer is positioned between the second electrode 420 and the EML 450.

Alternatively, the light emitting diode of an inverted structure may be manufactured, where the first charge transporting layer 440 as the electron transporting layer is positioned between the first electrode 410 and the EML 450 and the second charge transporting layer 460 as the hole transporting layer is positioned between the second electrode 420 and the EML 450. In this case, the inorganic compound of the chemical formula 1 may be used for the HTL of the second charge transporting layer.

By applying the inorganic compound of the chemical formula 1 to the first or second charge transporting layer 440 or 460 as the hole transporting layer, a HOMO (or valance band) energy level difference between the hole transporting layer and the EML 450 and a HOMO (or valance band) energy level difference in the hole transporting layer are reduced or removed, thus an HOMO energy barrier between the hole transporting layer and the EML 450 can be removed. Holes and electrons are injected in balance into the EML 450, thus a light emission efficiency of the light emitting diode 400 and the light emitting display device 300 can be improved, and a low voltage driving is possible thus a power consumption can be reduced.

Embodiments of the present invention are explained below with reference to examples, and are not limited thereto.

Synthesis Example 1: Synthesizing ZnS:Mn:Cu

A mixture of Zinc acetate($Zn(CH_3COO)_2$), $CuSO_4$, and $MnCl_2$ was mixed into an aqueous $Na_2S$ solution to synthesize ZnS:Mn:Cu nano particles, where a dosage amount of Mn and Cu was about 0.1 wt % to about 1.0 wt % with respect to ZnS. An aqueous solution of Zinc acetate (1M), $CuSO_4$ and $MnCl_2$ (0.1M) was added into an autoclaved D.I. water at a temperature of 70° C. While an inside ambient condition was maintained with $N_2$ being supplied through a condenser, a stirring was intensely conducted using a magnetic stirrer. Then, an 1M mercaptoethanol was added into the mixture and a stirring was conducted for 20 minutes. Finally, $Na_2S$ was added into the reaction mixture such that Zn:S has a mol ratio of 1:1, and a ZnS:Mn:Cu precipitate was produced. The reaction mixture was refluxed for one hour under the same condition. The produced precipitate was cleaned repeatedly with a D.I. water and was centrifuged (e.g., at 15,000 rpm) for 20 minutes. A final cleaning process was conducted using methanol to remove organic ingredients and other impurities remaining at the particles. A supernatant was discarded, and the precipitate was kept in a tube all night and dried at a room temperature. The dried precipitate was polished and a minute powder was obtained then kept for a later analysis.

Synthesis Example 2: Synthesizing ZnS:Mn:Ni

Through the processes of the synthesis example 1 that was modified to use $Ni(NO_3)_2$ as a nickel precursor replacing $CuSO_4$ as a copper precursor, ZnS:Mn:Ni nano particles were synthesized.

Synthesis Example 3: Synthesizing ZnS:Mn:Eu

Through the processes of the synthesis example 1 that was modified to use $EuCl_3$ as an europium precursor replacing $CuSO_4$ as a copper precursor, ZnS:Mn:Eu nano particles were synthesized.

Example 1: Forming a Light Emitting Diode

A light emitting diode was formed by applying ZnS:Mn:Cu nano particles of the synthesis example 1 to an HTL. An ITO on a glass substrate was patterned such that an light emission area of the substrate had a size of 3 mm*3 mm, and then the substrate was cleaned. Then, a light emitting layer and a cathode were stacked in a following order. A HIL (PEDOT:PSS; spin-coated (at 4000 rpm for 45 seconds); and 20~40 nm), a first HTL (TFB (dispersed in toluene); spin-coated (at 2000 rpm for 45 seconds); and 10~30 nm), a second HTL (ZnS:Mn:Cu (dispersed in ethanol); spin-coating (at 2000 rpm for 45 seconds); and 10~30 nm), an EML (InP/ZnS (dispersed in hexane); spin-coating (at 2000 rpm for 45 seconds); and 10~30 nm), an ETL (ET048 (pyrene based); thermal deposition; and 30~50 nm), an EIL (LiF; thermal deposition; and 10~30 nm), and a cathode (Al; thermal deposition; and 80 nm) were stacked.

After the deposition, the substrate was moved from a deposition chamber to a drying box in order to form a film then was encapsulated using an UV curing epoxy and a moisture getter. This light emitting diode has an emission area of 9 mm².

Example 2: Forming a Light Emitting Diode

Through the processes of the example 1 that was modified to apply ZnS:Mn:Ni nano particles of the synthesis example 2 to a second HTL, a light emitting diode was formed.

Example 3: Forming a Light Emitting Diode

Through the processes of the example 1 that was modified to apply ZnS:Mn:Eu nano particles of the synthesis example 3 to a second HTL, a light emitting diode was formed.

Comparative Example: Forming a Light Emitting Diode

Through the processes of the example 1 that was modified to deposit no second HTL and to use a first HTL made of TFB, a light emitting diode was formed.

Experiments: Evaluating Properties of Light Emitting Diodes

Respective light emitting diodes respectively formed by the examples 1 to 3 and the comparative example were each connected to an external power supply source, and EL properties of the diodes were evaluated using an constant current supply source (KEITHLEY) and a photometer, PR 650. In detail, a driving voltage (V), a current density (mA/cm²), and an external quantum efficiency (EQE) of each of the diodes formed by the examples 1 to 3 and the comparative example were measured. Measured results of the driving voltage (V) and the EQE are shown in a Table 1, and the voltage to current density is shown in FIG. 7.

TABLE 1

| | | 10 mA/cm² | |
|---|---|---|---|
| Samples | | Voltage (V) | EQE (%) |
| Example 1 | ZnS:Mn:Cu | 5.78 | 2.30 |
| Example 2 | ZnS:Mn:Ni | 5.67 | 2.46 |
| Example 3 | ZnS:Mn:Eu | 3.98 | 1.73 |
| Comparative example | TFB only | 9.37 | 1.53 |

Figure 7:
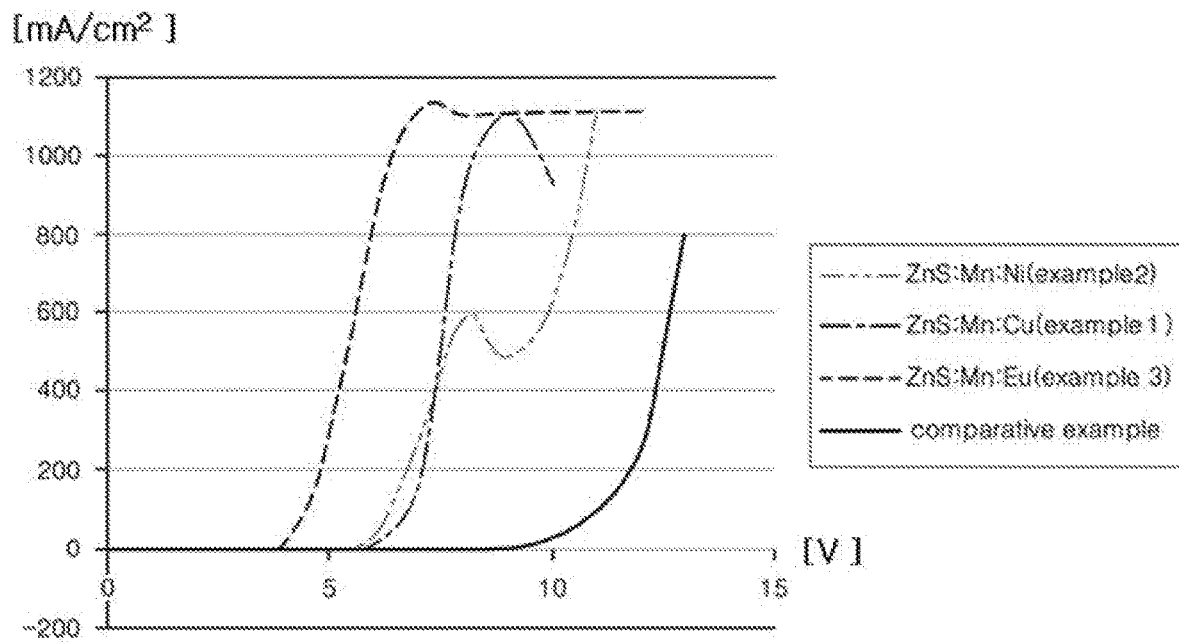
FIG. 7 is a graph illustrating measured results of voltages to current densities of light emitting diodes formed according to an embodiment of the present invention.

As shown in Table 1 and FIG. 7, compared with the light emitting diode of the comparative example, the light emitting diodes of the examples each using the HTL, which the nano particles doped with different metal positive ions is applied to, have voltages reduced by up to about 57.5%, have EQEs improved by up to about 60.8% and have current densities greatly improved. It is construed that this improvement of the light emission property is because the nano particles in an embodiment of the present invention are applied and thus a hole injection to the EML is improved. Therefore, it is seen that the light emitting diode and the light emitting display device can be realized which are operated at a low voltage and improve light emission efficiency and quantum efficiency.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A light emitting diode, comprising:
   a first electrode and a second electrode facing each other;
   a hole transporting layer between the first electrode and the second electrode; and
   an emitting material layer between the first electrode and the second electrode,
   wherein the hole transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with, and
   wherein a valance band energy level of the hole transporting layer sequentially decreases in order of a $M_1$ valance band energy level, a $M_2$ valance band energy level and an A valance band energy level; or, a valance band energy level of the hold transporting layer sequentially decreases in order of a $M_2$ valance band energy level, a $M_1$ valance band energy level and an A valance band energy level.

2. The light emitting diode according to claim 1, wherein each of the $M_1$ and $M_2$ is at least one selected from the group consisting of a transition metal positive ion, a poor metal positive ion, a rare earth metal positive ion, and a lanthanide metal positive ion.

3. The light emitting diode according to claim 1, wherein each of the $M_1$ and $M_2$ is selected from a group consisting of $Ni^{2+}$, $Mn^{2+}$, $Pb^{2+}$, $Cu^+$, $Cu^{2+}$, $Co^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$ and $Sm^{3+}$.

4. The light emitting diode according to claim 1, wherein the hole transporting layer includes:
 a hole injection layer between the first electrode and the second electrode; and
 a hole transport layer between the hole injection layer and the second electrode, and made of the inorganic compound of the chemical formula 1.

5. The light emitting diode according to claim 4, wherein the hole transport layer between the hole injection layer and the second electrode includes:
 a first hole transport layer between the hole injection layer and the second electrode, and made of an organic material; and
 a second hole transport layer between the first hole transport layer and the second electrode, and made of the inorganic compound of the chemical formula 1.

6. The light emitting diode according to claim 1, wherein the hole transporting layer includes:
 a hole injection layer between the first electrode and the second electrode; and
 a hole transport layer between the hole injection layer and the first electrode, and made of the inorganic compound of the chemical formula 1.

7. The light emitting diode according to claim 6, wherein the hole transport layer between the hole injection layer and the first electrode includes:
 a first hole transport layer between the hole injection layer and the first electrode, and made of an organic material; and
 a second hole transport layer between the first hole transport layer and the first electrode, and made of the inorganic compound of the chemical formula 1.

8. The light emitting diode according to claim 1, wherein the emitting material layer is between the first electrode and the hole transporting layer, or between the second electrode and the hole transporting layer.

9. The light emitting diode according to claim 8, wherein the emitting material layer includes an inorganic emitting particle.

10. The light emitting diode according to claim 9, wherein the inorganic emitting particle has a core-shell structure.

11. The light emitting diode according to claim 10, wherein the A of the chemical formula 1 is made of a same material as the shell.

12. The light emitting diode according to claim 10, wherein the A of the chemical formula 1 is the semiconductor nano particle selected from the group consisting of ZnS, ZnSe, CdS, CdSe, CdZnS, GaP and combinations thereof.

13. The light emitting diode according to claim 8, wherein the A of the chemical formula 1 is a nano inorganic particle having a valence band energy level that is the same as a HOMO energy level of the emitting material layer.

14. The light emitting diode according to claim 1, wherein the A of the chemical formula 1 is a semiconductor nano particle including a semiconductor nano particle of group II-VI, group III-V, group IV-VI or group I-III-VI.

15. The light emitting diode according to claim 1, wherein the metal oxide group includes ZnO, $TiO_2$, CoO, CuO, $Cu_2O$, FeO, $In_2O_3$, MnO, NiO, PbO, $Ce_2O_3$, $MoO_3$ and combinations thereof.

16. The light emitting diode according to claim 1, wherein each of the $M_1$ and $M_2$ is in an amount of 0.05 wt % to 50 wt %.

17. The light emitting diode according to claim 8, further comprising at least one exciton blocking layer adjacent to the emitting material layer.

18. A light emitting diode, comprising:
 a first electrode and a second electrode facing each other;
 a hole transporting layer between the first electrode and the second electrode; and
 an emitting material layer between the first electrode and the second electrode,
  wherein the hole transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with,
  wherein the hole transport layer between the hole injection layer and the second electrode includes:
   a first hole transport layer between the hole injection layer and the second electrode, and made of an organic material; and
   a second hole transport layer between the first hole transport layer and the second electrode, and made of the inorganic compound of the chemical formula 1, and
  wherein the first hole transport layer uses an organic material having a HOMO energy level between a HOMO energy level of the hole injection layer and a valance band energy level of the second hole transport layer.

19. The light emitting diode according to claim 18, wherein a valance band energy level of the hole transporting layer sequentially decreases in order of a $M_1$ valance band energy level, a $M_2$ valance band energy level and an A valance band energy level; or, a valance band energy level of the hole transporting layer sequentially decreases in order of a $M_2$ valance band energy level, a $M_1$ valance band energy level and an A valance band energy level.

20. A light emitting diode, comprising:
 a first electrode and a second electrode facing each other;
 a first charge transporting layer between the first electrode and the second electrode and adjacent to the first electrode;
 a second charge transporting layer between the first electrode and the second electrode and adjacent to the second electrode; and
 an emitting material layer between the first charge transporting layer and the second charge transporting layer,
  wherein the first or second charge transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with, and
  wherein a valance band energy level of the first or second charge transporting layer sequentially decreases in order of $M_1$ valance band energy level, a $M_2$ valance band energy level and an A valance band energy level or a valance band energy level of the first or second charge transporting layer sequentially decreases in order of a $M_2$ valance band energy level, a $M_1$ balance band energy level and an A valence band energy level.

21. The light emitting diode according to claim 20, wherein the A of the chemical formula 1 is a nano inorganic particle having a valence band energy level that is the same as a HOMO energy level of the emitting material layer.

22. The light emitting diode according to claim 20, wherein the emitting material layer includes an inorganic emitting particle.

23. The light emitting diode according to claim 22, wherein the inorganic emitting particle has a core-shell structure.

24. The light emitting diode according to claim 23, wherein the A of the chemical formula 1 is made of a same material as the shell.

25. The light emitting diode according to claim 20, further comprising at least one exciton blocking layer adjacent to the emitting material layer.

26. A light emitting display device, comprising:
a substrate;
a light emitting diode on the substrate; and
a driving element between the substrate and the light emitting diode and connected to the light emitting diode,
wherein the light emitting diode includes:
a first electrode and a second electrode facing each other;
a hole transporting layer between the first electrode and the second electrode; and
an emitting material layer between the first electrode and the second electrode,
wherein the hole transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with, and wherein a valance band energy level of the hole transporting layer sequentially decreases in order of a $M_1$ valance band energy level, a $M_2$ valance band energy level and an A valance band energy level; or, a valance band energy level of the hole transporting layer sequentially decreases in order of a $M_2$ valance band energy level, a $M_1$ valance band energy level and an A valance band energy level.

27. A light emitting display device, comprising:
a substrate;
a light emitting diode on the substrate; and
a driving element between the substrate and the light emitting diode and connected to the light emitting diode,
wherein the light emitting diode includes:
a first electrode and a second electrode facing each other;
a first charge transporting layer between the first electrode and the second electrode and adjacent to the first electrode;
a second charge transporting layer between the first electrode and the second electrode and adjacent to the second electrode; and
an emitting material layer between the first charge transporting layer and the second charge transporting layer,
wherein the first or second charge transporting layer includes an inorganic compound of a chemical formula 1, $A:M_1:M_2$, where the A is a semiconductor nano particle or a nano inorganic particle selected from a metal oxide group, and the $M_1$ and $M_2$ are different from each other and represent metal positive ions which the A is doped with, and
wherein a valance band energy level of the first or second charge transporting layer sequentially decreases in order of $M_1$ valance band energy level, a $M_2$ valance band energy level and an A valance hand energy level; or a valance band energy level of the first or second charge transporting layer sequentially decreases in order of a $M_2$ valance hand energy level, a $M_1$ balance band energy level and an A valence band energy level.

* * * * *